(12) United States Patent
Powell et al.

(10) Patent No.: US 8,388,754 B2
(45) Date of Patent: *Mar. 5, 2013

(54) SYSTEM AND METHOD FOR DEPOSITING A MATERIAL ON A SUBSTRATE

(75) Inventors: Ricky Charles Powell, Ann Arbor, MI (US); Andrew Kelly Gray, Perrysburg, OH (US); Todd Alden Coleman, Wayne, OH (US)

(73) Assignee: First Solar, Inc., Perrysburg, OH (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/027,976

(22) Filed: Feb. 15, 2011

(65) Prior Publication Data
US 2011/0132261 A1 Jun. 9, 2011

Related U.S. Application Data

(62) Division of application No. 11/380,088, filed on Apr. 25, 2006, now Pat. No. 7,927,659.

(60) Provisional application No. 60/674,676, filed on Apr. 26, 2005.

(51) Int. Cl.
*C23C 16/448* (2006.01)
*C23C 16/455* (2006.01)

(52) U.S. Cl. ........... 118/719; 118/726; 427/248.1

(58) Field of Classification Search ............ 118/719, 118/726
See application file for complete search history.

(56) References Cited

U.S. PATENT DOCUMENTS

| | | | |
|---|---|---|---|
| 3,858,548 A | 1/1975 | Tick | |
| 3,954,423 A | 5/1976 | Hamper et al. | |
| 3,966,127 A | 6/1976 | Pytlewski | |
| 4,512,868 A | 4/1985 | Fujimura et al. | |
| 4,606,776 A | 8/1986 | Salis | |
| 4,987,284 A | 1/1991 | Fujimura et al. | |
| 5,174,983 A | 12/1992 | Snail | |
| 5,248,349 A | 9/1993 | Foote et al. | |
| 5,445,973 A | 8/1995 | Hedstrom | |
| 5,837,320 A | 11/1998 | Hampden-Smith et al. | |
| 5,994,642 A | 11/1999 | Higuchi et al. | |
| 6,037,241 A | 3/2000 | Powell et al. | |
| 6,432,203 B1 | 8/2002 | Black et al. | |
| 6,444,043 B1 | 9/2002 | Gegenwart et al. | |
| 6,660,328 B1 | 12/2003 | Dahmen et al. | |
| 7,910,166 B2 | 3/2011 | Powell et al. | |
| 7,927,659 B2 | 4/2011 | Powell et al. | |
| 7,931,937 B2 | 4/2011 | Powell et al. | |
| 2001/0011524 A1 | 8/2001 | Witzman et al. | |
| 2002/0106461 A1* | 8/2002 | Talton | 427/596 |
| 2002/0129769 A1 | 9/2002 | Kim et al. | |
| 2003/0168013 A1* | 9/2003 | Freeman et al. | 118/726 |
| 2004/0031442 A1 | 2/2004 | Yamazaki et al. | |

OTHER PUBLICATIONS

Salis, U.S. Patent 4,606,776, Derwent Abstract Aug. 1996.

* cited by examiner

*Primary Examiner* — Joseph Miller, Jr.

(74) *Attorney, Agent, or Firm* — Dickstein Shapiro LLP (57) ABSTRACT

A method and apparatus for depositing a film on a substrate includes introducing a material and a carrier gas into a heated chamber. The material may be a semiconductor material, such as a cadmium chalcogenide. A resulting mixture of vapor and carrier gas containing no unvaporized material is provided. The mixture of vapor and carrier gas are remixed to achieve a uniform vapor/carrier gas composition, which is directed toward a surface of a substrate, such as a glass substrate, where the vapor is deposited as a uniform film.

16 Claims, 11 Drawing Sheets

SYSTEM AND METHOD FOR DEPOSITING A MATERIAL ON A SUBSTRATE

CLAIM OF PRIORITY

This application is a divisional application of U.S. application Ser. No. 11/380,088 filed Apr. 25, 2006, which claims priority under 35 U.S.C. §119(e) to U.S. application Ser. No. 60/674,676 filed Apr. 26, 2005, each of which is hereby incorporated by reference.

TECHNICAL FIELD

The present invention relates to photovoltaic device production.

BACKGROUND

In the manufacture of a photovoltaic device, semiconductor material is deposited on a glass substrate. This may be accomplished by vaporizing the semiconductor and directing the vaporized semiconductor towards the glass substrate surface, such that the vaporized semiconductor condenses and is deposited on the glass, forming a solid semiconductor film.

SUMMARY

In general, a method and system for depositing a semiconductor material on a substrate includes introducing a material and a carrier gas into a distributor assembly having a heated first chamber to form a vapor of the material. The material can be a powder, for example, a powder of a semiconductor material. The carrier gas and vapor are then directed through a series of successive heated chambers to form a uniform vapor/carrier gas composition. The uniformity of the gas composition can be provided by flow and diffusion of the vapor and gas incident to passing the vapor and gas through a plurality of chambers of the distributor assembly. After the composition has become uniform, it is directed out the distributor assembly and towards a substrate, causing a film to be formed on a surface of substrate. The substrate can be a glass substrate or another suitable substrate such as polymer substrate having a surface suitable for forming a uniform film. The film can be a semiconductor composition. The vapor and carrier gas composition may be passed through a filter after being introduced into the distributor assembly in order to ensure that solid particles of that material are not directed toward the substrate. Advantageously, the method and system for depositing a semiconductor material provides a semiconductor film with improved film thickness uniformity and grain structure uniformity.

In one aspect, a method for depositing a film on a substrate includes directing a powder such as cadmium sulfide or cadmium telluride and an inert carrier gas such as helium through a feed tube into a heated distributor assembly including a network of sequentially connected chambers. The distributor assembly may include a plurality of successively shrouded tubes such that the semiconductor powder and inert gas are introduced through a feed tube into a first heated tube the interior of which is passably connected to the interior of a second chamber. The first heated tube is heated such that the semiconductor powder forms a vapor. The vapor and carrier gas are then directed from the first heated tube through two flow paths defined by chambers included in the distributor assembly.

The space between the exterior of the first heated tube and the interior of a second tube surrounding the first heated tube defines a flow path. Movement of the vapor and carrier gas through multiple flow paths of the distributor assembly creates a flow which results in a uniform mixing of vaporized semiconductor and inert carrier gas. Additionally, passing the vapor and carrier gas through multiple flow paths can require the vapor to travel a greater distance to the substrate and can allow more time for the powder to completely vaporize. The method may also include passing the vapor through a filter or other barrier permeable to vapor but not to powder to ensure that no powder is deposited on a surface of the substrate. Reducing or substantially eliminating the amount of powder from the vapor/carrier gas composition and providing a uniform vapor/carrier gas composition results in a deposited film that is substantially uniform as to both thickness and grain structure, resulting in higher-quality and lower-cost production.

In another aspect, a system for depositing a material on a substrate includes a heated distributor assembly having a plurality of flow paths defined by sequentially connected chambers into which a powder and a carrier gas are introduced. The system includes a feed tube through which the powder and carrier gas are introduced into the first chamber of the distributor assembly. The distributor assembly may be heated by applying a current across one or more chambers included in the distributor assembly, or by another means that will heat at least a portion of the distributor assembly to a temperature sufficient to form a vapor from the powder. A heating element may be provided in the first chamber. One or more chambers in the distributor assembly may be heated in order to heat at least a portion of the distributor assembly. The system may also include a filter or other barrier permeable to vapor but not powder to substantially prevent powder from exiting the distributor assembly and being deposited on a surface of a substrate. The filter may be positioned within the first chamber.

The chambers in the distributor assembly are provided such that the vapor and carrier gas travel along multiple flow paths defined by chambers included in the distributor assembly. A first flow path may be provided proximate to the first chamber. After the powder introduced into the first chamber is vaporized, the vapor and carrier gas are directed into the proximate first flow path. A second flow path may be provided proximate to the first flow path. Vapor and carrier gas from the first flow path are directed from the first flow path to the proximate second flow path. The first and second flow paths provide a flow pattern for the vapor and carrier gas such that the vapor and carrier gas diffuse and a uniform vapor/carrier gas composition is obtained as the vapor and carrier gas are directed through flow paths defined within and between the chambers included in the distributor assembly. The chambers included in the distributor assembly may be provided as a plurality of successively shrouded tubes such that the vapor and carrier gas are introduced into a first chamber which is a tube disposed within (e.g., shrouded by) another tube. The shrouded tube includes one or more apertures through which the vapor and carrier gas are directed from the shrouded tube to the shroud tube.

The distributor assembly may also include a flow path defined by a non-tubular chamber. The distributor assembly may be designed such that the vapor and carrier gas are directed through multiple chambers defining multiple flow paths. An outlet can be provided at the end of the distributor assembly and is positioned such that the uniform vapor/carrier gas composition directed through the distributor assembly and outlet is directed toward a surface of a substrate upon which the semiconductor is deposited as a film on a surface of the substrate. The outlet can be located proximate to the second flow path. Where the last chamber through which the vapor/carrier gas composition can be directed can be a tube, the outlet may be a slot oriented along the length of the tube. The outlet may also include a manifold having a plurality of orifices through which the vapor and carrier gas are directed toward the substrate.

The substrate upon which the film is deposited can be introduced in the proximity of the distributor assembly outlet by a conveyor system. The conveyor system may include a gas hearth for supporting and transporting a plurality of substrates past the distributor assembly outlet for deposition.

The method and system described here have the advantage over known systems and methods of depositing a semiconductor film on a substrate of providing a film of uniform thickness and grain structure. These properties can be important, particularly with respect to the use of semiconductor films in solar panels. The method and system described here also provide improved definition of the film deposition area, resulting in higher material utilization. As a result, the method and system described result in higher efficiency in the production of solar panels than is provided with known methods and systems.

The method can provide a material film having a uniform thickness and composition. A solid introduced into the system can be maintained at a temperature sufficient to vaporize the material for a duration of time sufficient to ensure that substantially all the material that is passed through the system forms a vapor. Additionally, a solid to be vaporized and a carrier gas introduced into the system are passed through the system in such a manner that the vapor and the carrier gas mix to form and maintain a uniform composition; segregation between the vapor and the carrier gas which can occur when passing through a permeable structure such as a filter on account of the difference in molecular weight between the vapor and carrier gas is substantially reduced.

The details of one or more embodiments are set forth in the accompanying drawings and the description below. Other features, objects, and advantages will be apparent from the description and drawings, and from the claims.

DETAILED DESCRIPTION

An apparatus and method for depositing a semiconductor film on a glass substrate are described, for example, in U.S. Pat. No. 6,037,241, the disclosure of which is herein incorporated by reference in its entirety.

A solid material such as a semiconductor powder and carrier gas can be introduced into a heated permeable tubular chamber, where the solid material is vaporized. The vapor and carrier gas then pass through the walls of the heated permeable chamber into a shroud surrounding the chamber. The shroud can include an opening through which the vapor is directed toward a surface of a substrate, such as a glass substrate, where it is deposited as a film.

Figure 1:
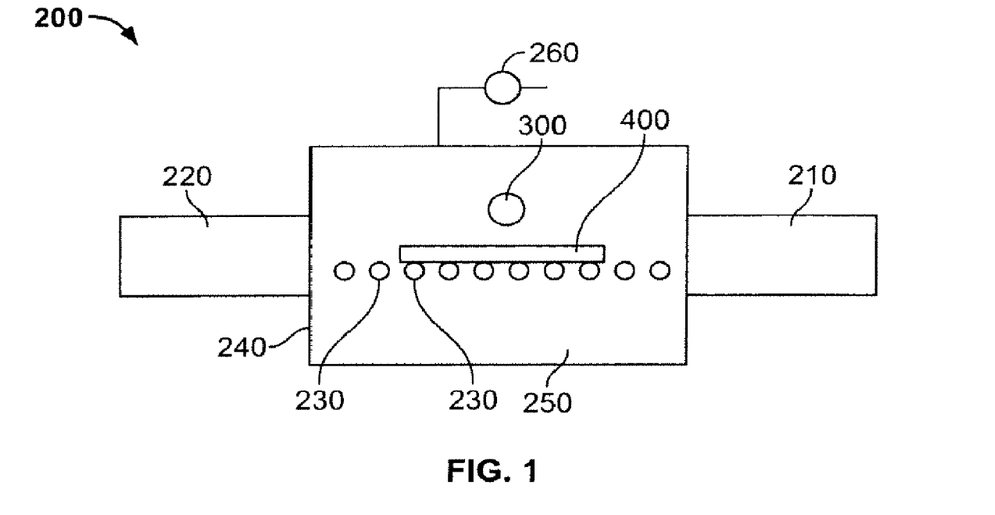
FIG. 1 is a drawing depicting a system for depositing a semiconductor on a glass sheet substrate.

With reference to FIG. 1 of the drawings, a substrate processing system 200 includes distributor assembly 300. Both the distributor assembly 300 and the method for processing a substrate 400 are described and exemplified here.

With continuing reference to FIG. 1, the system 200 includes a housing 240 defining a processing chamber 250 in which a material is deposited on a substrate 400. Substrate 400 can be a glass sheet. Housing 240 includes an entry station 210 and an exit station 220. Entry station 210 and exit station 220 can be constructed as load locks or as slit seals through which substrate 400 enters and exits the processing chamber 250. The housing 240 can be heated in any suitable manner such that its processing chamber can be maintained at a deposition temperature. The distributor temperature can be 500 degrees to 1200 degrees C. Substrate 400 can be heated during the processing to a substrate temperature. The substrate temperature can be 200 degrees to 650 degree C. Substrate 400 can be transported by any appropriate means such as rollers 230, or a conveyor belt, preferably driven by an attached electric motor.

Figure 2:
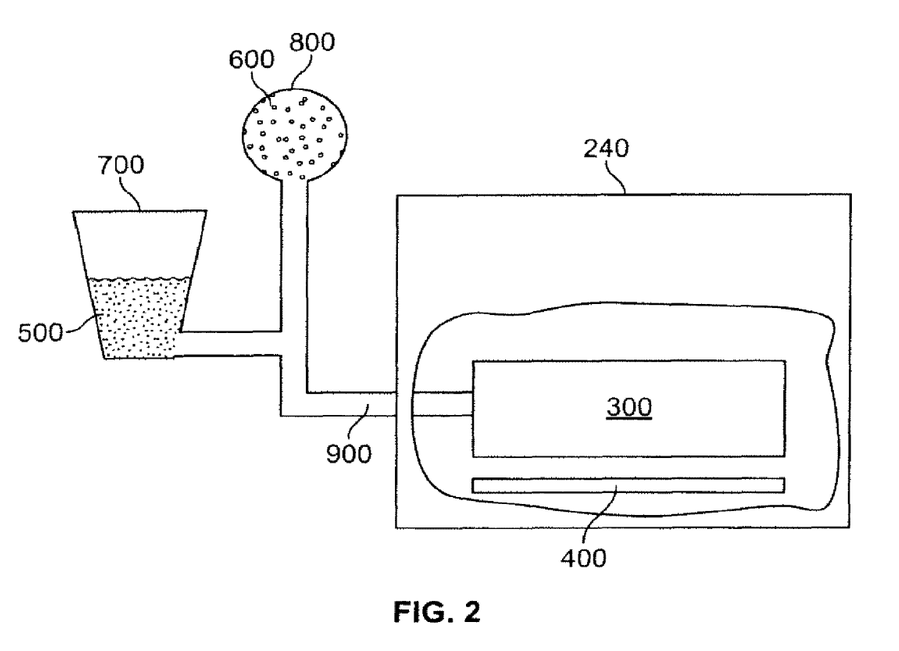
FIG. 2 is a drawing depicting a material supply for introducing a semiconductor powder and a carrier gas into a distributor assembly.

With reference to FIG. 2, distributor assembly 300 contained in housing 240 is connected by feed tube 900 to a material supply, which can include a hopper 700 containing a powder 500 and a carrier gas source 800 containing an appropriate carrier gas 600. Powder 500 can contact carrier gas 600 in feed tube 900, and both carrier gas 600 and powder 500 are introduced into distributor assembly 300.

After carrier gas 600 and powder 500 are introduced into distributor assembly 300, powder 500 is vaporized and directed through distributor assembly 300 along with carrier gas 600 in such a manner that carrier gas 600 and the vapor are mixed to form a uniform vapor/carrier gas composition. The uniform vapor/carrier gas composition is then directed out of distributor assembly 300 toward substrate 400. The lower temperature of substrate 400 compared to the temperature in distributor assembly 300 in order to maintain the material in vapor phase, causes condensation of the vapor on a surface of substrate 400, and the deposition of a film, which has a substantially uniform thickness and a substantially uniform structure demonstrating a uniform crystallization and a substantial absence of particulate material, such as unvaporized powder.

The exit point of the semiconductor vapor from distributor assembly 300 can be spaced from substrate 400 at a distance in the range of about 0.5 to about 5.0 cm to provide more efficient deposition. While greater spacing can be utilized, that may require lower system pressures and would result in material waste due to overspraying. Furthermore, smaller spacing could cause problems due to thermal warpage of substrate 400 during conveyance in the proximity of the higher temperature distributor assembly 300. Substrate 400 can pass proximate to the point where the semiconductor vapor exists distributor assembly 300 at a speed of at least about 20 mm per second to about 40 mm per second.

In performing the deposition, successful results have been achieved using cadmium telluride and cadmium sulfide as the material. However, it should be appreciated that other materials can be utilized which include a transition metal (Group IIB) and a chalcogenide (Group VIA). It should be further appreciated that additional materials that can be utilized to form a semiconductor film have many useful applications (such as the manufacture of photovoltaic devices) and may be used with the present invention. Also, dopants may be useful to enhance the deposition and properties of the resulting film.

Use of system 200 to perform the method of the invention has been performed with a vacuum drawn in the processing chamber 250 to about 0.5 to 760 Torr. In that connection, as illustrated in FIG. 1, the processing system 200 includes a suitable exhaust pump 260 for exhausting the processing chamber 250 of the housing 240 both initially and continuously thereafter to remove the carrier gas.

The carrier gas 600 supplied from the source 800 can be helium, which has been found to increase the glass temperature range and the pressure range that provide film characteristics such as deposition density and good bonding. Alternatively, the carrier gas can be another gas such as nitrogen, neon, argon or krypton, or combinations of these gases. It is also possible for the carrier gas to include an amount of a reactive gas such as oxygen that can advantageously affect growth properties of the material. A flow rate of 0.3 to 10 standard liters per minute of the carrier gas has been determined to be sufficient to provide the material flow to distributor assembly 300 for deposition on a substrate.

Figure 3:
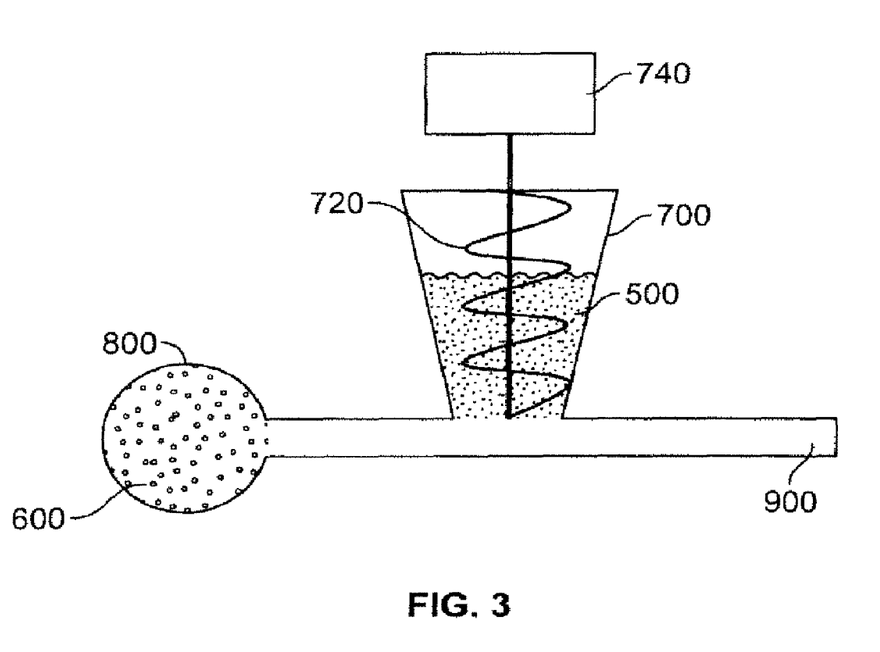
FIG. 3 is a drawing depicting an embodiment of a material supply.
Figure 4:
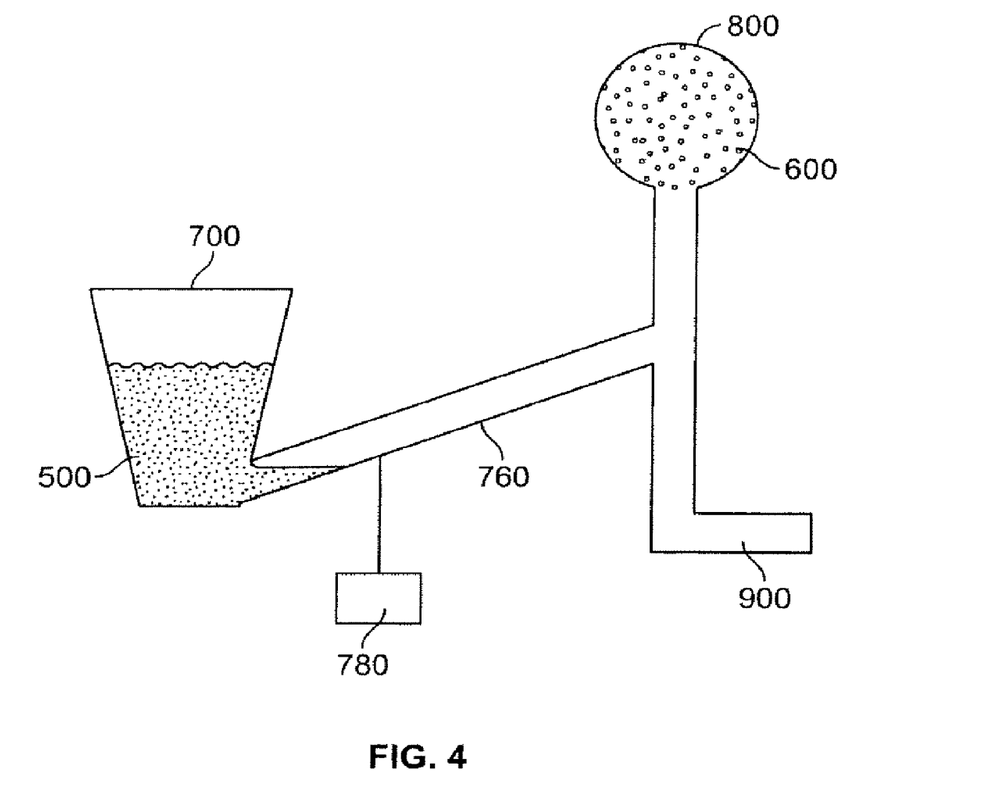
FIG. 4 is a drawing depicting an alternate embodiment of a material supply in accordance with the present invention.

It should be recognized that multiple material supplies having multiple hopper and multiple carrier gas sources may introduce carrier gas and material into the distributor assembly. A single material supply is shown in FIG. 2 and subsequent figures for the sake of clarity. FIG. 3 and FIG. 4 depict alternate embodiments of a material supply which can be used. As shown in FIG. 3, hopper 700 containing powder 500 may include a rotary screw 720, which, when rotated by actuator 740 delivers powder 500 into feed tube 900, where it is introduced into carrier gas 600 delivered from carrier gas source 800. Alternatively, as shown in FIG. 4, a vibration-actuated material source is depicted, in which a vibration introduced by vibratory feeder 780 causes powder 500 to incrementally move from hopper 700 into inclined passage 760. In this manner, powder is introduced into feed tube 900, along with carrier gas 600 from carrier gas source 800.

Figure 5:
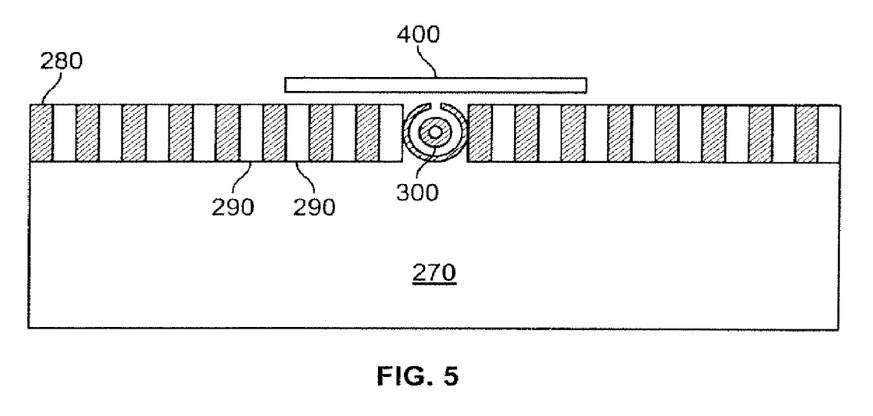
FIG. 5 is a drawing depicting an embodiment of a system for depositing a semiconductor on a downward-facing surface of a glass sheet substrate.

FIG. 5 represents an alternative embodiment of system 200 in which a semiconductor film may be deposited on a downward-facing surface of substrate 400. The alternate system depicted includes a refractory hearth 280 above a plenum 270 of heated pressurized gas. Holes 290 in hearth 280 provide for upward flow of the pressurized heated gas so as to support glass substrate 400 in a floating manner. As floating glass substrate 400 is conveyed along the length of hearth 280, the downward-facing surface passes proximate to distributor assembly 300, from which semiconductor vapor is directed toward and deposited as a film on substrate 400.

Various embodiments of distributor assembly 300 are described below.

Figure 6A:
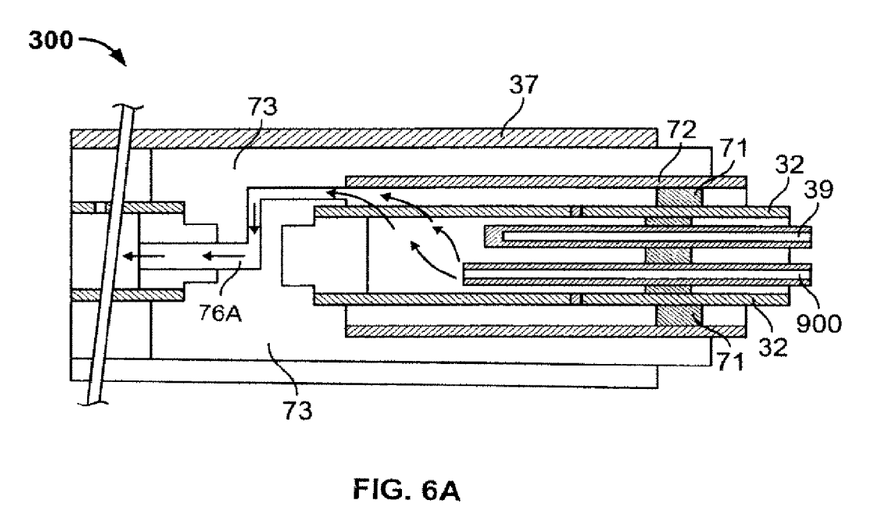
FIG. 6A is a drawing depicting an embodiment of a distributor assembly.
Figure 6B:
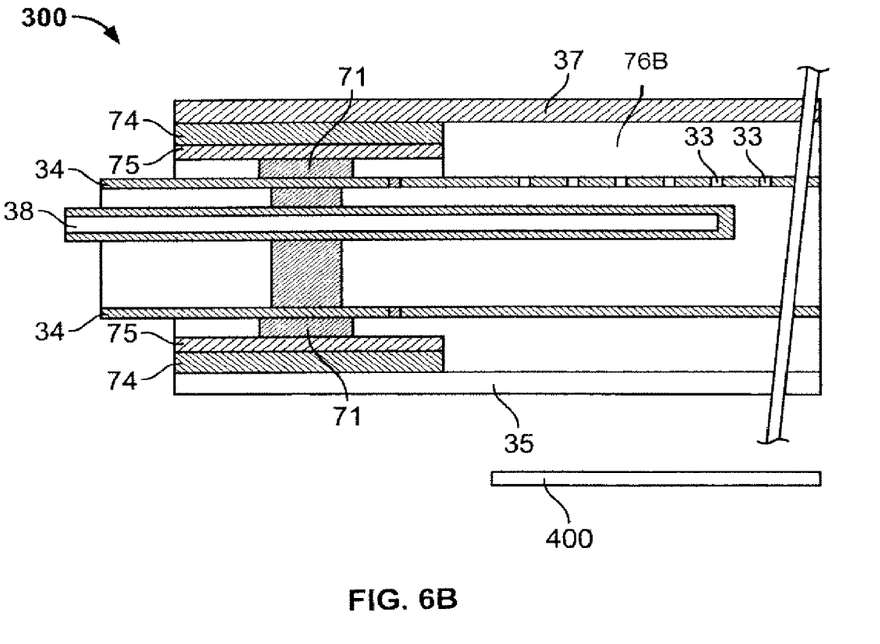
FIG. 6B is a drawing depicting a second view of a distributor assembly of FIG. 6A.

Referring to FIG. 6A and FIG. 6B, an embodiment of distributor assembly 300 is presented in cross-sectional view along the length of the distributor assembly 300. A powder and a carrier gas are introduced into a heated tube 32, which is heated resistively. The resistive electrical path is provided by tubular center electrode 73, which can be formed from graphite. Heated tube 32 is permeable and can be made from SiC. Also contained within the interior of heated tube 32 is thermowell 39 for monitoring the temperature of heated tube 32.

The heat provided from resistively heated tube 32 causes the powder to vaporize inside heated tube 32, after which the resulting vapor and carrier gas permeate the walls of heated tube 32 and are directed to the interior of surrounding sleeve 72, which can be composed of mullite. The powder that is not vaporized does not permeate the walls of heated tube 32. Surrounding sleeve 72 is oriented inside a larger-diameter outer tubular sheath 37, with portions of tubular center electrode 73 separating surrounding sleeve 72 from outer tubular sheath 37, which, like surrounding sleeve 72 can be made from mullite. The vapor and carrier gas are prevented from escaping the interior of surrounding sleeve 72 by a stopper sleeve 71, which can be made of ceramic tape packing. The vapor and carrier gas are directed into first flow path 76A formed in tubular center electrode 73. As the vapor and carrier gas travel through distributor assembly 300, and first flow path 76A in particular, the irregular flow pattern causes the vapor and carrier gas to mix into a substantially uniform vapor/carrier gas composition.

Referring now to FIG. 6B, which depicts the opposite portion of distributor assembly 300 shown in FIG. 6A, the uniform vapor/carrier gas composition exits first flow path 76A into the interior of a second heated tube 34, which may include a second thermowell 38. Second heated tube 34, like first heated tube 32, is oriented within larger-diameter outer tubular sheath 37. At the end of second heated tube 34 where the uniform vapor/carrier gas composition enters second heating tube 34 from first flow path 76A, the second heated tube 34 is isolated from outer tubular sheath 37 by tubular central electrode 73. At the opposite end of second heated tube 34, space is provided between second heated tube 34 and outer tubular sheath 37 by a tubular graphite spacing bushing 74, an electrically isolated mullite cylindrical sleeve 75, and ceramic tape packing 71 as required.

After the vapor/carrier gas uniform composition is directed into second heated tube 34, it travels within and along second heated tube 34, continuously remixing the vapor/carrier gas composition. The uniform vapor/carrier gas composition is then directed out of second heated tube 34 into second flow path 76B, defined by the exterior of second heated tube 34 and the interior of outer tubular sheath 37, through a plurality of outlets 33, which can be holes drilled in a line along a portion of the length of one side of second heated tube 34. Directing the uniform vapor/carrier gas composition from outlets 33 within outer tubular sheath 37 and through second flow path 76B disperses the streams of vapor/carrier gas composition directed through outlets 33 and further increases vapor/carrier gas uniformity of composition, pressure and velocity. The vapor/carrier gas composition exits second flow path 76B through slot 35, which is preferably provided on a side of outer tubular sheath 37 substantially opposite outlets 33 to maximize the path length of second flow path 76B and the uniformity of vapor/carrier gas composition. Substantially uniform vapor/carrier gas composition exiting slot 35 (which can be provided along the entire length of outer tubular sheath 37) is directed toward underlying substrate 400 so that a film may be deposited thereon.

Figure 7A:
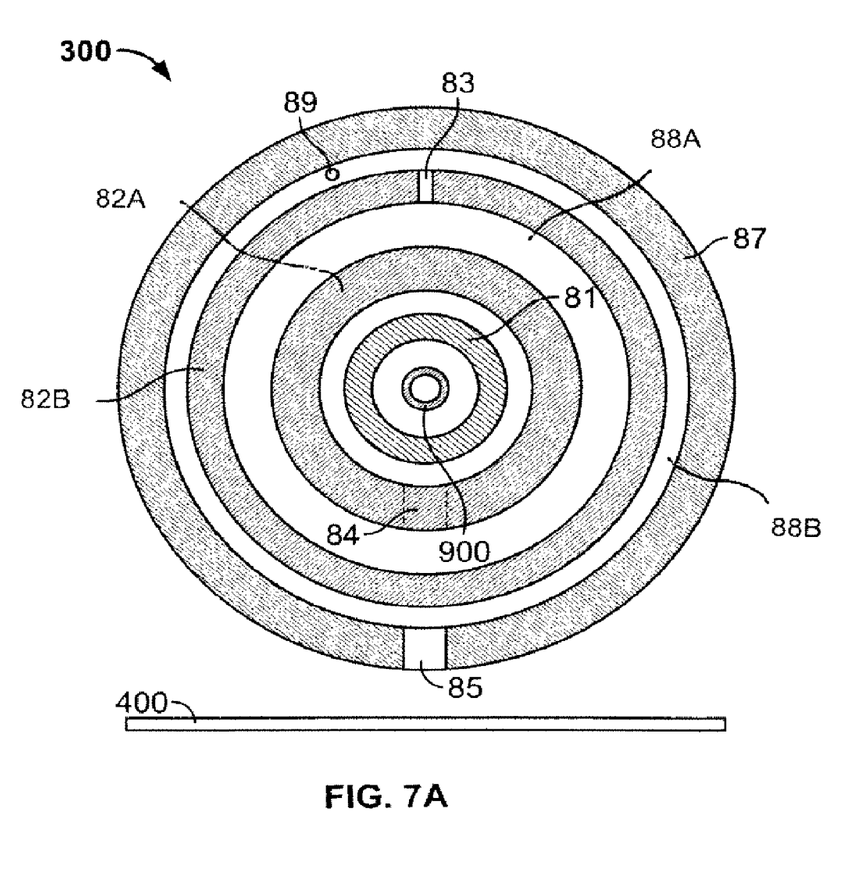
FIG. 7A is a drawing depicting a first view of another embodiment of a distributor assembly.
Figure 7B:
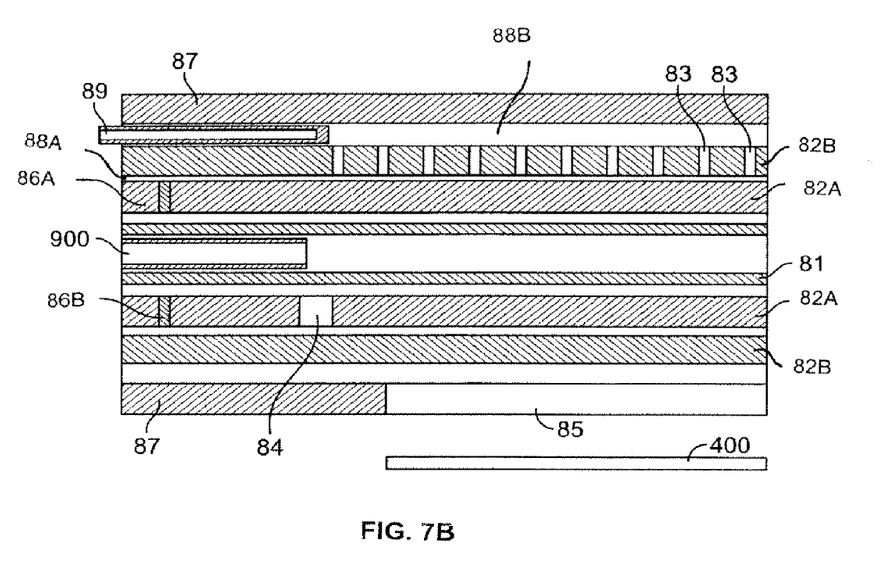
FIG. 7B is a drawing depicting a second view of a distributor assembly of FIG. 7A.
Figure 8A:
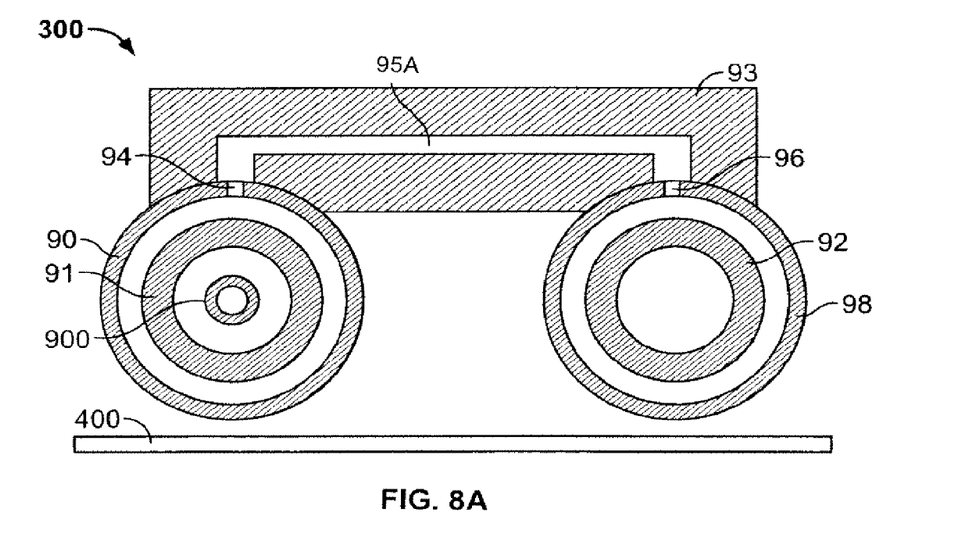
FIG. 8A is a drawing depicting a first view of an embodiment of a distributor assembly.
Figure 8B:
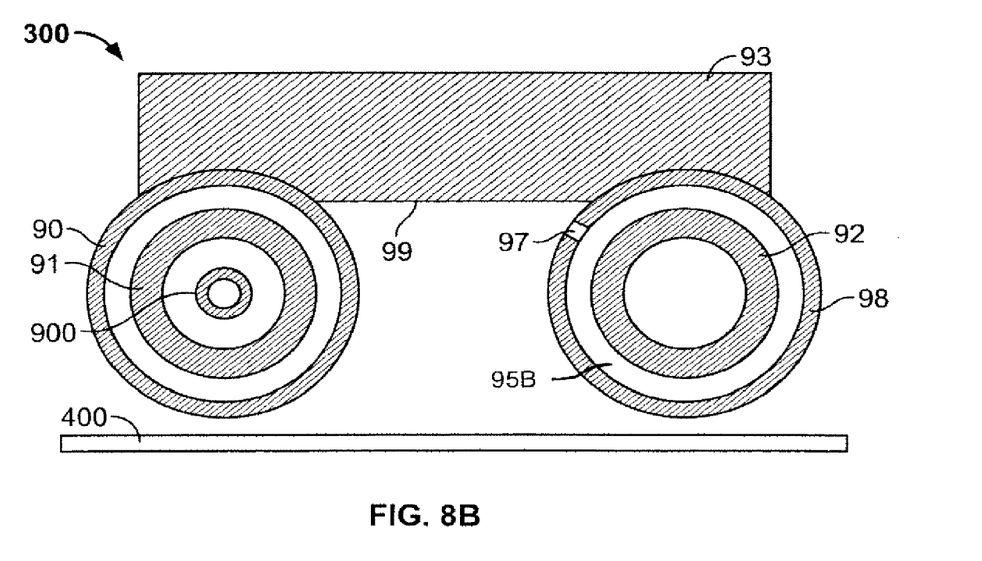
FIG. 8B is a drawing depicting a second view of an embodiment of a distributor assembly of FIG. 8A.

Referring now to FIG. 7A and FIG. 7B, an alternate embodiment of distributor assembly 300 is depicted. A powder and carrier gas are introduced into distributor assembly 300 through feed tube 900. The powder and carrier gas are first directed into a filter tube 81 positioned inside heater tube 82A. Heater tube 82A heats filter tube 81 to a temperature sufficient to vaporize the powder inside filter tube 81. Filter tube 81 can also be resistively heated, and can have an outer diameter of about 20 mm to about 40 mm (preferably about 30 mm), and an inner diameter of about 10 mm to about 20 mm (preferably about 16 mm). Heated tube 81 is permeable to the vapor, so the vapor and carrier gas permeate filter tube 81 and are directed into heater tube 82A. Filter tube 81 can be formed from SiC.

After the vapor and carrier gas permeate through filter tube 81 and into heater tube 82A, the vapor and carrier gas travel within heater tube 82A, which causes the vapor and carrier gas to mix. Heater tube 82A can be resistively heated and can be formed from impermeable SiC, such as the Kanthal Globar type CRL element available from Sandvik Materials Technology (http://www.smt.sandvik.com). Heater tube 82A can have an outer diameter of about 40 mm to about 55 mm (preferably about 50 mm), an inner diameter of about 35 mm to about 45 mm (preferably about 45 mm), and may be attached to low-resistance electrified ends 86A of distributor assembly 300 by internal joints 86B.

As new vapor and carrier gas permeate into heater tube 82A from filter tube 81, the mixed vapor and carrier gas are directed out of heater tube 82A through outlet 84, which can be a single drilled hole located near one end of heater tube 82A, and which can have a diameter of about 10 mm to about 15 mm (preferably about 13 mm). The vapor and carrier gas are directed through outlet 84, which causes the vapor and carrier gas to continue to mix while entering first flow path 88A defined by the exterior of heater tube 82A and the interior of manifold 82B, which can be formed from graphite and which can have an outer diameter of about 75 mm to about 100 mm (preferably about 86 mm), and an inner diameter of about 60 mm to about 80 mm (preferably about 70 mm).

The flow of the vapor and carrier gas in first flow path 88A causes the vapor and carrier gas to continue to mix and form a uniform vapor/carrier gas composition. The vapor and carrier gas are directed through first flow path 88A from drilled hole 84 on one side of heater tube 82A around heating tube 82A inside manifold 82B to a plurality of distribution holes 83 positioned in a line along the length of manifold 82B on a side of manifold 86 substantially opposite the side of heater tube 82A where drilled hole 84 is located. A thermowell 89 is also provided proximate to heater tube 82A in order to monitor the temperature of distributor assembly 300.

The uniform vapor/carrier gas composition is directed from first flow path 88A out of manifold 82B through distribution holes 83 into the interior of outer tubular sheath 87, which can be formed from mullite, and which, along with the exterior of manifold 82B defines a second flow path 88B. Distribution holes 83 can have a diameter of about 1 mm to about 5 mm (preferably about 3 mm). Travel of the uniform vapor/carrier gas composition through second flow path 88B disperses the streams of uniform vapor/carrier gas composition directed from distribution holes 83 and further increases the vapor/carrier gas uniformity of composition, pressure, and velocity. The uniform vapor/carrier gas composition is directed to slot 85 running along a portion of the length of outer tubular sheath 87, and located on a side of outer tubular sheath 87 substantially opposite the position on manifold 82B where distribution holes 83 are located. Outer tubular sheath 87 can be formed from mullite, and can have an outer diameter of about 80 mm to about 150 mm (preferably about 116 mm), and an inner diameter of about 60 mm to about 130 mm (preferably about 104 mm). After it is directed from second flow path 88B and distributor assembly 300 via slot 85, the vapor is deposited as a film on underlying substrate 400, which is conveyed past distributor assembly 300.

It should be noted that FIG. 7B depicts a portion of distributor assembly 300 and an additional feed tube and material source may be provided at an opposite end of distributor assembly 300, which is not shown in FIG. 7B.

Referring now to FIG. 8A and FIG. 8B, an alternate embodiment of a distributor assembly 300 in accordance with the present invention is depicted. A powder and a carrier gas are directed into the interior of first heater tube 91 via feed tube 900. First heater tube 91 is resistively heated to a temperature sufficient to vaporize the powder and is permeable to the resulting vapor and the carrier gas, but impermeable to the powder. Consequently, any powder that is not vaporized is unable to pass from the interior of first heater tube 91. First heater tube 91 can be formed from SiC.

After the powder is vaporized to form a vapor, the vapor and carrier gas permeate the walls of first heater tube 91 and are directed to the space between first heater tube 91 and first tubular sheath 90, which can be formed from mullite, graphite, or cast ceramic. Passage within first tubular sheath 90 causes the vapor and carrier gas to mix to form a uniform vapor/carrier gas composition. The uniform vapor/carrier composition is directed through first outlet 94. First outlet 94 can be a single drilled hole and the vapor and carrier gas are further remixed as they pass through first outlet 94.

As shown in FIG. 8A, the uniform vapor/carrier gas composition directed through first outlet 94 enters first flow path 95A, which leads to a second tubular sheath 98. First flow path 95A may be formed in a block 93, which in turn physically connects the interiors of first tubular sheath 90 and second tubular sheath 98, and which can be formed from mullite, graphite or cast ceramic. The uniform vapor/carrier gas composition is directed through first flow path 95A are then directed through inlet 96, which can be a single drilled hole formed in second tubular sheath 98, which can be formed from mullite.

Referring now to FIG. 8B, the uniform vapor/carrier gas composition is directed through second flow path 95B defined by the exterior of second heater tube 92 and the interior of second tubular sheath 98. Passage of the uniform vapor/carrier gas composition through second flow path 95B remixes the vapor and carrier gas, maintaining the uniform vapor/carrier gas composition. The uniform vapor/carrier gas composition is then directed from second flow path 95B out a plurality of terminal outlets 97, which can be drilled holes provided along at least a portion of the length of the second tubular sheath 98. The uniform vapor/carrier gas composition can be directed toward a vapor cap 99, which may include a downward-facing surface of block 93 and which, along with the first tubular sheaths 90 and second tubular sheath 98, defines a space (preferably about 1 to about 2 cm wide) spreads streams of the uniform vapor/carrier gas composition emitted from terminal outlets 97 and further increases the uniformity of the vapor/carrier gas with respect to composition, pressure, and velocity. The uniform vapor/carrier gas composition is consequently directed away from distributor assembly 300, towards underlying substrate onto which the vapor is deposited as a film.

The embodiments described above are offered by way of illustration and example. It should be understood that the examples provided above may be altered in certain respects and still remain within the scope of the claims. For example, the component dimensions described above are suitable for use with substrates up to 60 cm wide; adjustments can be made when using substrates of different sizes. It should be appreciated that, while the invention has been described with reference to the above preferred embodiments, other embodiments are within the scope of the claims.

What is claimed is:

1. A distributor assembly comprising:
a first chamber including an interior for receiving a solid material and carrier gas;
a heating element associated with the first chamber for providing a temperature high enough to vaporize at least a portion of the solid material into a vapor;
a first flow path located outside and at least partially surrounding the first chamber for receiving the vapor and the carrier gas from the first chamber and for providing a material flow sufficiently indirect to mix the vapor and the carrier gas into a substantially uniform vapor/carrier gas composition;
a second flow path for receiving the vapor and the carrier gas from the first flow path and for providing a material flow sufficiently indirect to maintain the substantially uniform vapor/carrier gas composition including a flow path inlet located proximate to an outlet of the first flow path and a flow path outlet offset from the flow path inlet such that the flow direction of the vapor/carrier gas must change while flowing from the flow path inlet to the flow path outlet; and
an outlet for directing the uniform vapor/carrier gas composition for deposition onto a surface of a substrate.

2. The distributor assembly of claim 1, wherein at least one of the first flow path and the second flow path is defined by a non-tubular chamber.

3. The distributor assembly of claim 1, wherein the first chamber comprises the heating element and is heated by resistive heating.

4. The distributor assembly of claim 1, wherein the heating element is capable of maintaining the first chamber at a temperature of at least 500 degrees C.

5. The distributor assembly of claim 4, wherein the heating element is capable of maintaining the first chamber at a temperature of about 500 degrees C. to about 700degrees C.

6. The distributor assembly of claim 1, wherein the first chamber comprises a plurality of distribution holes.

7. The distributor assembly of claim 1, further comprising a second chamber having a plurality of distribution holes.

8. The distributor assembly of claim 1, wherein the first chamber is configured such that substantially no solid material is directed into the first flow path.

9. A system for depositing a film on a substrate comprising:
a material source connected to a distributor assembly and for introducing a solid material and a carrier gas into the distributor assembly, wherein the distributor assembly comprises:
a first chamber including an interior for receiving the solid material and the carrier gas;
a heating element associated with the first chamber and for providing a temperature high enough to vaporize at least a portion of the solid material into a vapor;
a first flow path located outside and at least partially surrounding the first chamber for receiving the vapor and the carrier gas from the first chamber and for providing a material flow sufficiently indirect to mix the vapor and the carrier gas into a substantially uniform vapor/carrier gas composition;
a second flow path for receiving the vapor and the carrier gas from the first flow path and for providing a material flow sufficiently indirect to maintain the substantially uniform vapor/carrier gas composition including a flow path inlet located proximate to an outlet of the first flow path and a flow path outlet offset from the flow path inlet such that the flow direction of the vapor/carrier gas must change while flowing from the flow path inlet to the flow path outlet; and
an outlet for directing the uniform vapor/carrier gas composition for deposition onto a surface of a substrate; and
a conveyor for transporting the substrate proximate to the distributor assembly.

10. The system of claim 9, wherein at least one of the first flow path and the second flow path is defined by a non-tubular chamber.

11. The system of claim 9, wherein the first chamber comprises the heating element and is heated by resistive heating.

12. The system of claim 9, wherein the heating element is capable of maintaining the first chamber at a temperature of at least 500 degrees C.

13. The system of claim 12, wherein the heating element is capable of maintaining the first chamber at a temperature of about 500 degrees C. to about 700 degrees C.

14. The system of claim 9, wherein the first chamber comprises a plurality of distribution holes.

15. The system of claim 9, further comprising a second chamber having a plurality of distribution holes.

16. The system of claim 9, wherein the first chamber is configured such that substantially no solid material is directed into the first flow path.

* * * * *